United States Patent
Ishikawa et al.

(10) Patent No.: US 12,127,342 B2
(45) Date of Patent: Oct. 22, 2024

(54) METAL BASE SUBSTRATE, ELECTRONIC COMPONENT MOUNTING SUBSTRATE

(71) Applicant: MITSUBISHI MATERIALS CORPORATION, Tokyo (JP)

(72) Inventors: Fumiaki Ishikawa, Saitama (JP); Shintaro Hara, Saitama (JP); Hiroyuki Mori, Tsukuba (JP); Kosei Fukuoka, Kitamoto (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 223 days.

(21) Appl. No.: 17/913,877

(22) PCT Filed: Mar. 30, 2021

(86) PCT No.: PCT/JP2021/013452
§ 371 (c)(1),
(2) Date: Sep. 23, 2022

(87) PCT Pub. No.: WO2021/200895
PCT Pub. Date: Oct. 7, 2021

(65) Prior Publication Data
US 2023/0111128 A1    Apr. 13, 2023

(30) Foreign Application Priority Data
Mar. 31, 2020  (JP) ................................ 2020-062822

(51) Int. Cl.
*H05K 1/00* (2006.01)
*H05K 1/05* (2006.01)
*H05K 1/18* (2006.01)

(52) U.S. Cl.
CPC .............. *H05K 1/056* (2013.01); *H05K 1/181* (2013.01); *H05K 2201/0209* (2013.01)

(58) Field of Classification Search
CPC ................... H05K 1/056; H05K 1/181; H05K 2201/0209
See application file for complete search history.

(56) References Cited

U.S. PATENT DOCUMENTS 6,252,179 B1 *   6/2001   Lauffer ................ H05K 1/0206
                                                         174/258
2002/0139459 A1  10/2002  Hatano et al.
(Continued)

FOREIGN PATENT DOCUMENTS

JP     H11-008450 A   1/1999
JP     5650084 B2     1/2015
(Continued)

OTHER PUBLICATIONS

International Search Report mailed Jun. 15, 2021, issued for PCT/JP2021/013452 and English translation thereof.
(Continued)

*Primary Examiner* — Pete T Lee
(74) *Attorney, Agent, or Firm* — Locke Lord LLP

(57) ABSTRACT

A metal base substrate of the present invention is a metal base substrate including a metal substrate, an insulating layer laminated on one surface of the metal substrate, and a circuit layer laminated on a surface of the insulating layer opposite to the metal substrate side, in which the circuit layer is made of a metal having a semi-softening temperature of 100° C. or higher and 150° C. or lower, the insulating layer contains a resin, and a relationship between a thickness t (μm) of the insulating layer and an elastic modulus E (GPa) of the insulating layer at 100° C. satisfies a following formula (1).

$$10 < t/E \ldots \quad (1)$$

4 Claims, 1 Drawing Sheet

(56) References Cited

U.S. PATENT DOCUMENTS

2008/0004367 A1* 1/2008 Takada ............... C08L 51/003
  522/107
2013/0025839 A1* 1/2013 Egitto ............... H05K 1/0206
  428/137

FOREIGN PATENT DOCUMENTS

| JP | 5665449 B2 | 2/2015 |
| JP | 2015-043417 A | 3/2015 |
| JP | 2020-013874 A | 1/2020 |
| WO | 2019/151122 A1 | 8/2019 |

OTHER PUBLICATIONS

Supplementary European Search Report mailed Apr. 18, 2024, issued for EP21781514.1.

* cited by examiner

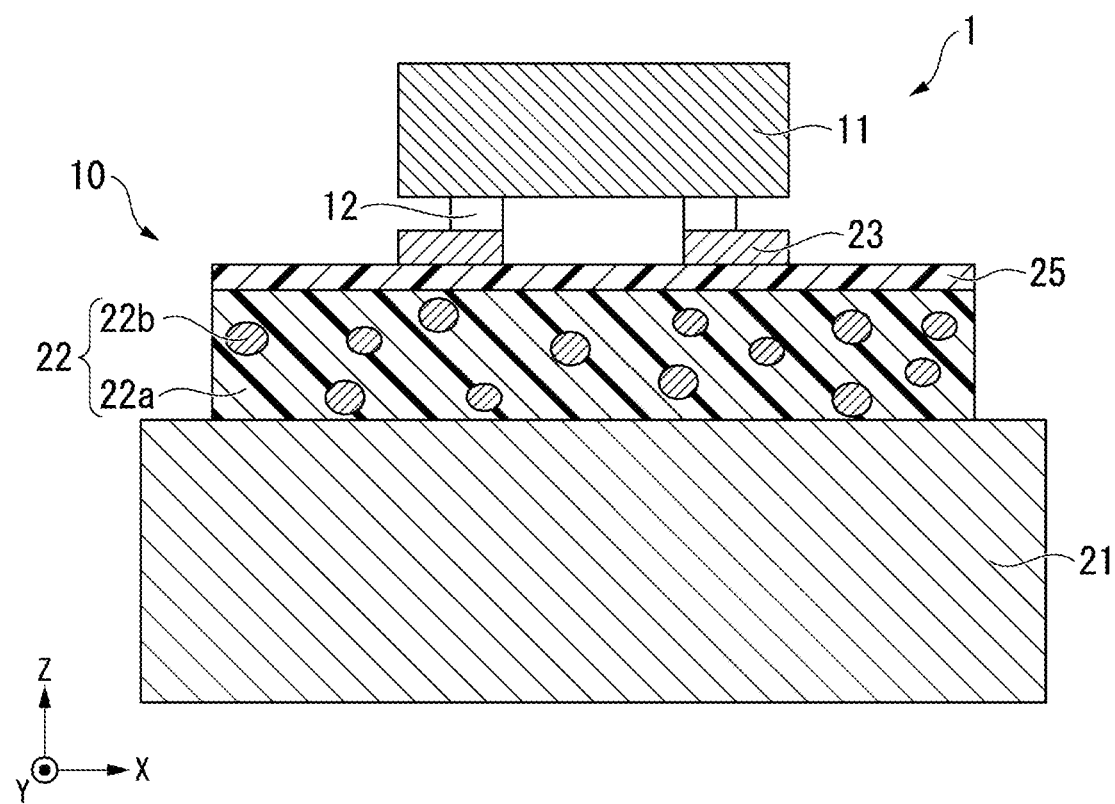

METAL BASE SUBSTRATE, ELECTRONIC COMPONENT MOUNTING SUBSTRATE

TECHNICAL FIELD

The present invention relates to a metal base substrate and an electronic component-mounting substrate using the same.

Priority is claimed on Japanese Patent Application No. 2020-062822, filed Mar. 31, 2020, the content of which is incorporated herein by reference.

BACKGROUND ART

Substrates for mounting electronic components such as semiconductor elements are preferably metal base substrates capable of efficiently dissipating heat generated by the operation of the electronic components to the outside. As the metal base substrates, metal base substrates in which a metal substrate is used as a base substrate and this metal substrate, an insulating layer, and a circuit layer are laminated in this order are known. An electronic component is bonded onto the circuit layer via a solder layer. In the metal base substrate configured as described above, heat generated from the electronic component is transferred to the metal substrate via the insulating layer and dissipated from the metal substrate to the outside.

The insulating layer of the metal base substrate is generally formed of an insulating resin composition containing a resin having excellent insulating properties and ceramic particles having excellent thermal conductivity (thermally conductive filler or an inorganic filling material). As the resin for the insulating layer, a polyimide resin, a polyamide-imide resin, and a silicone resin are used. Conventionally, in such metal base substrates, the elastic modulus of a resin that configures the insulating layer is decreased to reduce thermal stress that is applied to the solder layer (for example, refer to Patent Documents 1 and 2).

CITATION LIST

Patent Documents

[Patent Document 1]
Japanese Patent No. 5650084
[Patent Document 2]
Japanese Patent No. 5665449

SUMMARY OF INVENTION

Technical Problem

However, in the inventions disclosed in Patent Documents 1 and 2, thermal stress caused by the expansion of the metal substrate can be alleviated by decreasing the elastic modulus of the resin that configures the insulating layer, but there were limitations on significantly reducing thermal stress that is applied to the solder layer due to the thermal expansion of the circuit layer. In addition, as the elastic modulus of the resin that configures the insulating layer decreases, the insulating layer becomes more flexible, which makes it more impossible to suppress the thermal expansion of the circuit layer.

The present invention has been made in consideration of such circumstances, and an objective of the present invention is to provide a metal base substrate in which a solder crack is less likely to be initiated even when thermal cycles are applied in a state where an electronic component is bonded via a solder layer and an electronic component-mounting substrate using the same.

Solution to Problem

In order to solve the above-described problem, the present inventors found the following finding. That is, when the range of the semi-softening temperature of a circuit layer is limited, and the relationship between the thickness of an insulating layer and the elastic modulus of a resin that configures the insulating layer is defined, thermal stress that is applied to a solder layer can be suppressed.

Based on such a finding, this invention proposes the following means.

A metal base substrate of the present invention is a metal base substrate including a metal substrate, an insulating layer laminated on one surface of the metal substrate, and a circuit layer laminated on a surface of the insulating layer opposite to the metal substrate side, in which the circuit layer is made of a metal having a semi-softening temperature of 100° C. or higher and 150° C. or lower, the insulating layer contains a resin, and a relationship between a thickness t (μm) of the insulating layer and an elastic modulus E (GPa) of the insulating layer at 100° C. satisfies a following formula (1).

$$10 < t/E \ldots \quad (1)$$

In addition, in the present invention, the insulating layer may contain a filler dispersed in the resin.

In addition, in the present invention, an adhesive layer may be disposed at least one of between the insulating layer and the circuit layer and between the insulating layer and the metal substrate. In addition, the adhesive layer may contain a filler dispersed therein, and a volume ratio of the filler may be smaller than that in the insulating layer.

An electronic component-mounting substrate of the present invention includes each of the above-described metal base substrates and an electronic component bonded to the circuit layer of the metal base substrate via a solder layer.

BRIEF DESCRIPTION OF DRAWING

FIG. 1 is a cross-sectional view showing an electronic component-mounting substrate including a metal base substrate according to one embodiment of the present invention.

DESCRIPTION OF EMBODIMENTS

Hereinafter, one embodiment of the present invention will be described in detail with appropriate reference to the drawing. In the drawing to be used in the following description, there is a case where a characteristic part is shown in an enlarged manner for convenience in order to facilitate the understanding of the characteristics of the present invention, and the dimensional ratio and the like of each configuration element are different from actual ones in some cases. A material, a dimension, and the like exemplified in the following description are simply examples, and the present invention is not limited thereto and can be appropriately modified and carried out as long as the effect is exhibited.

FIG. 1 is a cross-sectional view showing an electronic component-mounting substrate including a metal base substrate according to one embodiment of the present invention.

An electronic component-mounting substrate 10 has a metal base substrate 20 and an electronic component 11 bonded to the metal base substrate 20 via a solder layer 12. The electronic component 11 is not particularly limited, and examples thereof include a semiconductor element, a resistor, a capacitor, a crystal oscillator, and the like. Examples of the semiconductor element include MOSFET (metal-oxide-semiconductor field effect transistor), IGBT (insulated gate bipolar transistor), LSI (large scale integration), LED (light emitting diode), an LED chip, and LED-CSP (LED-chip size package).

For the solder layer 12, a variety of solders, for example, Sn—Ag—Cu solder can be used, and there are no particular limitations.

The metal base substrate 20 has a metal substrate 21, an insulating layer 22 laminated on one surface of the metal substrate 21, and circuit layers 23 laminated on a surface of the insulating layer 22 opposite to the metal substrate 21 side.

The metal substrate 21 is a member that serves as a base of the metal base substrate 20. As the metal substrate 21, the metal substrate 21, for example, a copper sheet, an aluminum sheet, and a laminated sheet thereof can be used.

The insulating layer 22 is formed of an insulating thermally conductive resin composition containing an insulating resin (resin) 22a and ceramic particles (filler) 22b. When the insulating layer 22 is formed of a substance containing the highly thermally conductive and insulating ceramic particles 22b dispersed in the insulating resin 22a having high insulating properties, it is possible to further reduce the thermal resistance of the entire metal base substrate 20 from the circuit layers 23 through the metal substrate 21 while maintaining the insulating properties. This makes it possible to easily dissipate the heat generated from the electronic component 11 from the metal substrate 21 side.

The insulating resin 31 is preferably a polyimide resin, a polyamide-imide resin, or a mixture thereof. The polyimide resin and the polyamide-imide resin have an imide bond and thus have excellent heat resistance and mechanical characteristics.

As the ceramic particles 22b, which are an example of the filler, silica (silicon dioxide) particles, alumina (aluminum oxide) particles, boron nitride (BN) particles, titanium oxide particles, alumina-doped silica particles, alumina hydrate particles, aluminum nitride particles, and the like can be used. Either one of these ceramic particles 22b may be used or a combination of two or more of these ceramic particles may be used. Among these ceramic particles, alumina particles are preferred because of the high thermal conductivity. The form of the ceramic particles 22b is not particularly limited, but is preferably agglomerated particles of fine ceramic particles or single crystal ceramic particles.

The agglomerated particles of fine ceramic particles may be an agglomerate in which the primary particles are relatively weakly linked to each other or may be an aggregate in which the primary particles are relatively strongly linked to each other.

In addition, the agglomerated particles may form a particle assemblage in which the agglomerated particles further assemble to each other. When the primary particles of the ceramic particles 22b form agglomerated particles and are dispersed in the insulating resin (resin) 22a of the insulating layer 22, the mutual contact between the ceramic particles 22b forms networks, which makes it easy to conduct heat between the primary particles of the ceramic particles 22b and improves the thermal conductivity of the insulating layer 22.

As commercially available products of the agglomerated particles of the fine ceramic particles, it is possible to use silica particles such as AE50, AE130, AE200, AE300, AE380, and AE90E (all manufactured by Nippon Aerosil Co., Ltd.), T400 (manufactured by Wacker Chemie AG) and SFP-20M (manufactured by Denka Company Limited), alumina particles such as Alu65 (manufactured by Nippon Aerosil Co., Ltd.) and AA-04 (manufactured by Sumitomo Chemical Co., Ltd.), boron nitride particles such as AP-170S (manufactured by Maruka Corporation), titanium oxide particles such as AEROXIDE® $TiO_2$ P90 (manufactured by Nippon Aerosil Co., Ltd.), alumina-doped silica particles such as MOX170 (manufactured by Nippon Aerosil Co., Ltd.), alumina hydrate particles manufactured by Sasol Limited, or the like.

The single crystal ceramic particles are preferably a alumina single crystal particles having an α-alumina ($\alpha Al_2O_3$) crystal structure. As commercially available products of the α-alumina single crystal particles, AA-03, AA-04, AA-05, AA-07, and AA-1.5 of the advanced alumina (AA) series on sale by Sumitomo Chemical Co., Ltd. and the like can be used.

The content of the ceramic particles 22b in the insulating layer 22 needs to be, for example, in a range of 60% by volume or more and 80% by volume or less. When the content of the ceramic particles 22b becomes too small, there is a concern that the thermal conductivity of the insulating layer 22 may not sufficiently improve and the thermal resistance of the entire metal base substrate 20 may become large. On the other hand, when the content of the ceramic particles 22b becomes too large, the content of the insulating resin 22a relatively decreases, the elastic modulus of the insulating layer 22 becomes too high, and it becomes difficult to alleviate stress that is applied to the solder layer 12 due to thermal cycles with the insulating layer 22.

The thickness of the insulating layer 22 is not particularly limited, but is, for example, preferably in a range of 1 μm or more and 200 μm or less and more preferably in a range of 3 μm or more and 100 μm or less.

The insulating layer 22 of the metal base substrate 20 of the present embodiment is formed such that the relationship between the thickness t (μm) of the insulating layer 22 and the elastic modulus E (GPa) of the insulating layer 22 at 100° C. satisfies the following formula (1).

$$10 < t/E \ldots \quad (1)$$

When the elastic modulus of the insulating layer 22 is decreased such that the relationship between the thickness t of the insulating layer 22 and the elastic modulus E of the insulating layer 22 satisfies the above-described formula (1), stress caused by the thermal expansion of the metal substrate 21 can be sufficiently alleviated.

The circuit layer 23 needs to be a metal foil having a semi-softening temperature of 100° C. or higher and 150° C. or lower, and for example, aluminum, copper, and alloys of these metals can be used. Among these metals, copper is preferable. Examples of the copper include 4N copper (purity: 99.99%). Such 4N copper preferably contains a small amount of an additive element in order to adjust the semi-softening temperature to 100° C. or higher and 150° C. or lower. Examples of the additive element include yttrium, scandium, samarium, lanthanum, cerium, boron, titanium, vanadium, chromium, manganese, iron, zirconium, hafnium, neodymium, tantalum, calcium, and manganese.

The film thickness of the circuit layer 23 is in a range of 10 μm or more and 2000 μm or less and preferably in a range of 20 μm or more and 200 μm or less. When the film thickness of the circuit layer 23 becomes too thin, there is a concern that the allowable current may become small or the thermal resistance may become high. On the other hand, when the film thickness of the circuit layer 23 becomes too thick, there is a concern that it may become difficult to form a circuit pattern by etching.

For the circuit layer 23 of the present embodiment, a metal foil having a semi-softening temperature of 100° C. or higher and 150° C. or lower, for example, a 4N copper foil is used.

The semi-softening temperature mentioned herein means an annealing temperature corresponding to an intermediate yield strength between, while a sample is being annealed and yield strengths are being measured by a tensile test, a yield strength before the annealing and a yield strength when the sample has been completely softened (a state where the yield strength does not change any longer even when the annealing temperature is further raised after 30 minutes of annealing is regarded as the complete softening). The yield strength before annealing is regarded as the yield strength after cold rolling.

In addition to the above-described configuration, an adhesive layer 25 may be further provided between the insulating layer 22 and the circuit layer 23 or/and between the insulating layer 22 and the metal substrate 21. In the present embodiment, an example in which the adhesive layer 25 is provided between the insulating layer 22 and the circuit layer 23 is shown.

The adhesive layer 25 is preferably made of a resin. As the resin, it is possible to use a silicone resin, an epoxy resin, a polyamide-imide resin, and a polyimide resin. The silicone resin includes modified silicone resins into which various organic groups have been introduced. Examples of the modified silicone resins include polyimide-modified silicone resins, polyester-modified silicone resins, urethane-modified silicone resins, acrylic-modified silicone resins, olefin-modified silicone resins, ether-modified silicone resins, alcohol-modified silicone resins, fluorine-modified silicone resins, amino-modified silicone resins, mercapto-modified silicone resins, and carboxy-modified silicone resins. Examples of the epoxy resins include bisphenol A epoxy resins, bisphenol F epoxy resins, novolak epoxy resins, aliphatic epoxy resins, and glycidylamine epoxy resins. These resins may be used singly or two or more resins may be used in combination.

In the adhesive layer 25, a thermally conductive filler may be dispersed in order to improve thermal conductivity.

As the thermally conductive filler, ceramic particles can be used. Examples of the ceramic particles include silica particles, alumina particles, boron nitride particles, titanium oxide particles, alumina-doped silica particles, alumina hydrate particles, and phosphoric acid-coated aluminum nitride particles.

The volume ratio of the filler that is contained in the adhesive layer 25 is preferably set to be smaller than that of the filler that is contained in the insulating layer 22. The content of the filler in the adhesive layer 22 needs to be in a range of 20% by volume or more and 60% by volume or less in a case where, for example, ceramic particles are used as the filler.

According to the metal base substrate 20 of the present embodiment configured as described above and the electronic component-mounting substrate 10 using the same, as the circuit layer 23, a circuit layer having a semi-softening temperature of 100° C. or higher and 150° C. or lower is used, and the relationship between the thickness t (µm) of the insulating layer 22 and the elastic modulus E (GPa) of the insulating layer 22 at 100° C. are made to satisfy the above-described formula (1), whereby, even when thermal cycles are applied in a state where the electronic component 11 is bonded via the solder layer 12, the application of an excessive stress to the solder layer 12 can be suppressed, and the metal base substrate 20 in which a solder crack is less likely to be initiated and the electronic component-mounting substrate 10 using the same can be realized.

Hitherto, one embodiment of the present invention has been described, but this embodiment is proposed as an example and does not intend to limit the scope of the invention. This embodiment can be carried out in various other forms and can be omitted, substituted, or modified in various manners within the scope of the gist of the invention. This embodiment or modifications thereof are included in the scope or gist of the invention and, similarly, included in inventions described in the claims and the equivalent scope thereof.

EXAMPLES

The effect of the present invention was verified.

(Production of Copper Foil that Serves as Circuit Layer)

Yttrium (Y) was added to oxygen-free copper having a purity of 99.996% by mass or more so as to obtain a concentration shown in Table 1 and melted by vacuum melting (0.1 Pa), and the obtained ingot was hot-rolled to a thickness of 10 mm, machined, repeatedly annealed and cold-rolled to obtain a predetermined thickness.

(Production of Coating Liquid for Forming an Insulating Layer)

As ceramic particles, alumina ($Al_2O_3$) particles (AA-07 manufactured by Sumitomo Chemical Co., Ltd.) were prepared. 1.0 g of the prepared alumina particles were injected into 10 g of NMP (N-methyl-2-pyrrolidone) and treated with ultrasonic waves for 30 minutes to prepare a ceramic particle dispersion liquid.

Next, a polyimide solution (commercially available product) of a solvent-soluble polyimide having an elastic modulus at 100° C. of 100 MPa and a ceramic particle dispersion liquid were mixed together such that the content of the ceramic particles became 60% by volume of the total amount of a resin component and the ceramic particles. Next, the mixture was diluted with a solvent such that the concentration of the polyimide in the mixture became 5% by mass. Subsequently, the obtained mixture was dispersed by repeating a high-pressure injection treatment at a pressure of 50 MPa 10 times using a wet atomizer (Star Burst manufactured by Sugino Machine Limited) to prepare a ceramic particle-dispersed polyimide solution (coating liquid for forming an insulating layer).

(Formation of Insulating Layer)

The coating liquid for forming an insulating layer was applied onto a surface of a 50 mm×50 mm copper substrate having a thickness of 2.0 mm by the bar coating method such that a value obtained by dividing the thickness (µm) of an insulating layer to be generated by heating the coating liquid for forming an insulating layer by the elastic modulus at 100° C. (GPa) of the insulating layer became a value shown in Table 1 to form a coating layer for forming an insulating layer. Next, the copper substrate on which the coating layer for forming an insulating layer was formed was disposed on a hot plate, the temperature was raised from room temperature up to 60° C. at 3° C./min, the copper substrate was heated at 60° C. for 100 minutes, then, the temperature was further raised up to 120° C. at 1° C./min, and the copper substrate was heated at 120° C. for 100 minutes to dry the coating layer for forming an insulating layer. After that, the copper substrate was heated at 250° C. for 1 minute and at 400° C. for 1 minute to form an insulating layer on one surface of the copper substrate.

As the elastic modulus of the insulating layer, a value measured by the following measuring procedure was used.

The insulating layer was applied to a 0.1 mm copper sheet and dried, and then the copper sheet was removed by etching to isolate an insulating film. The elastic modulus at 100° C. of the obtained insulating film was measured by a tensile formula using a dynamic viscoelasticity measuring instrument (solid viscoelasticity analyzer RSA-G2: manufactured by TA Instruments Japan Inc.)). As measurement conditions, the frequency was set to 1 Hz, and the temperature rise rate was set to 1° C./min.

(Pasting the Circuit Layer)

A 40 mm×40 mm copper foil (wiring layer) was overlaid on the insulating layer in a thickness shown in Table 1 and then heated in a vacuum at a temperature of 215° C. for 120 minutes under the application of a pressure of 5 MPa using a carbon jig to paste the insulating layer and the copper foil. A metal base substrate in which the copper substrate, the insulating layer, and the copper foil were laminated in this order was produced in the above-described manner.

Table 1 shows the verification results of Present Invention Examples 1 to 36 and Comparative Examples 1 to 3. As for "reliability" in Table 1, as a result of a reliability test shown below, metal base substrates for which the reliability was 80% or more were evaluated as O, and metal base substrates for which the reliability was less than 80% were evaluated as X.

(Reliability Test)

An insulating layer was formed on a metal substrate, a copper foil was formed as a wiring layer on the insulating layer, furthermore, Sn—Ag—Cu solder was applied to form a solder layer having a length of 2.5 cm, a width of 2.5 cm, and a thickness of 100 and a 2.5 cm×2.5 cm Si chip was mounted on this solder layer to produce a test body. 3000 thermal cycles were applied to the produced test body. One thermal cycle included cooling at −40° C. for 30 minutes and heating at 150° C. for 30 minutes. The test body after the application of the thermal cycles were embedded in a resin, an observation surface formed by polishing a cross section near the center of the chip was observed, and the length (mm) of a crack initiated in the solder layer was measured. A value calculated from the length of one side of the solder layer and the measured length of the crack by the following formula showing the reliability was regarded as the bonding reliability. Metal base substrates for which the bonding reliability was 90% or more were evaluated as O, and the other metal base substrates were evaluated as X.

Reliability (%)={(length of one side of solder layer (25 mm)−2×length of crack)/length of one side of bonding layer (25 mm)}×100

TABLE 1

| | Semi-softening temperature (° C.) | Copper purity | Concentration of additive substance (Y) (mol ppm) | Thickness of circuit layer (μm) | Thickness of insulating layer/elastic modulus (μm/GPa) | Reliability |
|---|---|---|---|---|---|---|
| Present Invention Example 1 | 100 | 4N | 6 | 70 | 100 | O |
| Present Invention Example 2 | 110 | 4N | 9 | 18 | 100 | O |
| Present Invention Example 3 | 110 | 4N | 9 | 35 | 100 | O |
| Present Invention Example 4 | 110 | 4N | 9 | 70 | 100 | O |
| Present Invention Example 5 | 110 | 4N | 9 | 1000 | 100 | O |
| Present Invention Example 6 | 110 | 4N | 9 | 2000 | 100 | O |
| Present Invention Example 7 | 110 | 4N | 9 | 4000 | 100 | O |
| Present Invention Example 8 | 110 | 4N | 9 | 6000 | 100 | O |
| Present Invention Example 9 | 110 | 4N | 9 | 70 | 80 | O |
| Present Invention Example 10 | 120 | 4N | 22 | 18 | 100 | O |
| Present Invention Example 11 | 120 | 4N | 22 | 35 | 100 | O |
| Present Invention Example 12 | 120 | 4N | 22 | 70 | 100 | O |
| Present Invention Example 13 | 120 | 4N | 22 | 1000 | 100 | O |
| Present Invention Example 14 | 120 | 4N | 22 | 2000 | 100 | O |
| Present Invention Example 15 | 120 | 4N | 22 | 4000 | 100 | O |
| Present Invention Example 16 | 120 | 4N | 22 | 6000 | 100 | O |
| Present Invention Example 17 | 120 | 4N | 22 | 18 | 50 | O |
| Present Invention Example 18 | 120 | 4N | 22 | 35 | 50 | O |
| Present Invention Example 19 | 120 | 4N | 22 | 70 | 50 | O |
| Present Invention Example 20 | 120 | 4N | 22 | 1000 | 50 | O |
| Present Invention Example 21 | 120 | 4N | 22 | 2000 | 50 | O |

TABLE 1-continued

|  | Semi-softening temperature (° C.) | Copper purity | Concentration of additive substance (Y) (mol ppm) | Thickness of circuit layer (μm) | Thickness of insulating layer/elastic modulus (μm/GPa) | Reliability |
|---|---|---|---|---|---|---|
| Present Invention Example 22 | 120 | 4N | 22 | 4000 | 50 | ○ |
| Present Invention Example 23 | 120 | 4N | 22 | 6000 | 50 | ○ |
| Present Invention Example 24 | 120 | 4N | 22 | 70 | 10 | ○ |
| Present Invention Example 25 | 120 | 4N | 22 | 70 | 10 | ○ |
| Present Invention Example 26 | 120 | 4N | 22 | 70 | 10 | ○ |
| Present Invention Example 27 | 130 | 4N | 38 | 18 | 100 | ○ |
| Present Invention Example 28 | 130 | 4N | 38 | 35 | 100 | ○ |
| Present Invention Example 29 | 130 | 4N | 38 | 70 | 100 | ○ |
| Present Invention Example 30 | 130 | 4N | 38 | 1000 | 100 | ○ |
| Present Invention Example 31 | 130 | 4N | 38 | 2000 | 100 | ○ |
| Present Invention Example 32 | 130 | 4N | 38 | 4000 | 100 | ○ |
| Present Invention Example 33 | 130 | 4N | 38 | 6000 | 100 | ○ |
| Present Invention Example 34 | 140 | 4N | 47 | 70 | 100 | ○ |
| Present Invention Example 35 | 150 | 4N | 61 | 70 | 100 | ○ |
| Present Invention Example 36 | 100 | 6N | 0 | 70 | 100 | ○ |
| Comparative Example 1 | 160 | 4N | 79 | 70 | 100 | X |
| Comparative Example 2 | 160 | 4N | 79 | 70 | 100 | X |
| Comparative Example 3 | 120 | 4N | 22 | 70 | 5 | X |

According to the results shown in Table 1, it was confirmed that the metal base substrates of Present Invention Examples 1 to 36 in which the semi-softening temperature of the circuit layer was 100° C. or higher and 150° C. or lower and the relationship between the thickness t (μm) of the insulating layer and the elastic modulus E (GPa) of the insulating layer at 100° C. satisfied the following formula (1) were metal base substrates in which the reliability satisfied requirements and a solder crack was less likely to be initiated in the solder layer even when the thermal cycles were applied. On the other hand, in the metal base substrates of Comparative Examples 1 to 3, the reliability does not satisfy the requirements, and there is a concern that a solder crack may be initiated in the solder layer when thermal cycles are applied. Therefore, it was possible to confirm the effect of the metal base substrate of the present invention.

REFERENCE SIGNS LIST

10: Electronic component-mounting substrate
11: Electronic component
12: Solder layer
20: Metal base substrate
21: Metal substrate
22: Insulating layer
22a: Insulating resin (resin)
22b: Ceramic particles (filler)
23: Circuit layer

What is claimed is:

1. A metal base substrate comprising:
   a metal substrate;
   an insulating layer laminated on one surface of the metal substrate; and
   a circuit layer laminated on a surface of the insulating layer opposite to the metal substrate side,
   wherein the circuit layer is made of a metal having a semi-softening temperature of 100° C. or higher and 150° C. or lower,
   the insulating layer contains a resin, and
   a relationship between a thickness t (μm) of the insulating layer and an elastic modulus E (GPa) of the insulating layer at 100° C. satisfies a following formula (1), $$10 < t/E \ldots \qquad (1).$$

2. The metal base substrate according to claim 1,
   wherein the insulating layer contains a filler dispersed in the resin.

3. The metal base substrate according to claim 2, further comprising:
   an adhesive layer in which fillers are dispersed, the adhesive layer being disposed in at least one of between the insulating layer and the circuit layer and between the insulating layer and the metal substrate,
   wherein a volume ratio of the filler in the adhesive layer is smaller than that in the insulating layer.

4. An electronic component-mounting substrate comprising:
- the metal base substrate according to claim 1; and
- an electronic component bonded to the circuit layer of the metal base substrate via a solder layer.

* * * * *